United States Patent
Drab

(10) Patent No.: US 11,177,155 B2
(45) Date of Patent: Nov. 16, 2021

(54) DIRECT BOND METHOD PROVIDING THERMAL EXPANSION MATCHED DEVICES

(71) Applicant: RAYTHEON COMPANY, Waltham, MA (US)

(72) Inventor: John J. Drab, Santa Barbara, CA (US)

(73) Assignee: RAYTHEON COMPANY, Waltham, MA (US)

( * ) Notice: Subject to any disclaimer, the term of this patent is extended or adjusted under 35 U.S.C. 154(b) by 91 days.

(21) Appl. No.: 16/592,556

(22) Filed: Oct. 3, 2019

(65) Prior Publication Data
US 2020/0035539 A1    Jan. 30, 2020

Related U.S. Application Data

(62) Division of application No. 15/331,149, filed on Oct. 21, 2016, now Pat. No. 10,453,731.

(51) Int. Cl.
*H01L 21/00* (2006.01)
*H01L 21/683* (2006.01)
(Continued)

(52) U.S. Cl.
CPC .......... *H01L 21/6835* (2013.01); *B24B 37/20* (2013.01); *H01L 23/562* (2013.01);
(Continued)

(58) Field of Classification Search
CPC .............. H01L 21/6835; H01L 23/562; H01L 27/14687; H01L 27/1469; H01L 27/14; H01L 2924/351; H01L 2224/16145; H01L 2224/13111; H01L 2224/13023; H01L 2224/13116; H01L 2224/13109; H01L 2224/13113; H01L 2221/68368; H01L 2221/68354; B24B 37/20
See application file for complete search history.

(56) References Cited

U.S. PATENT DOCUMENTS 5,308,980 A    5/1994 Barton et al.
5,591,678 A    1/1997 Bendik et al.
(Continued)

FOREIGN PATENT DOCUMENTS

WO    9417557 A1    8/1994

OTHER PUBLICATIONS

Goorsky et al., Water Bonding of CdZnTe/Si Structures, ECS Transactions, 2006, 3 (6) 327-333.
(Continued)

*Primary Examiner* — Jeffry H Aftergut
(74) *Attorney, Agent, or Firm* — Cantor Colburn LLP

(57) ABSTRACT

A method of transferring an integrated circuit (IC) onto an alternative substrate is provided at a wafer level to enable coefficient of thermal expansion (CTE) matching for a circuit layer to a different material. The method is executable relative to a wafer with a circuit layer, a first major surface, a second major surface opposite the first major surface, and a substrate affixed to the first major surface. The method includes temporarily bonding a handle to the second major surface, removing a majority of the substrate to expose the first major surface and bonding a second substrate to the first major surface with deposited bonding material.

5 Claims, 4 Drawing Sheets

(51) Int. Cl.
  *B24B 37/20*     (2012.01)
  *H01L 23/00*     (2006.01)
  *H01L 27/146*    (2006.01)
  *H01L 27/14*     (2006.01)

(52) U.S. Cl.
  CPC .......... *H01L 27/14* (2013.01); *H01L 27/1469* (2013.01); *H01L 27/14687* (2013.01); *H01L 2221/68354* (2013.01); *H01L 2221/68368* (2013.01); *H01L 2224/13023* (2013.01); *H01L 2224/13109* (2013.01); *H01L 2224/13111* (2013.01); *H01L 2224/13113* (2013.01); *H01L 2224/13116* (2013.01); *H01L 2224/16145* (2013.01); *H01L 2924/351* (2013.01)

(56) References Cited

U.S. PATENT DOCUMENTS

| | | | |
|---|---|---|---|
| 6,911,375 B2* | 6/2005 | Guarini | H01L 21/6835 257/E21.568 |
| 7,723,815 B1 | 5/2010 | Peterson et al. | |
| 8,154,099 B2 | 4/2012 | Hampp et al. | |
| 2004/0009649 A1* | 1/2004 | Kub | B82Y 30/00 438/459 |
| 2004/0241958 A1 | 12/2004 | Guarini et al. | |
| 2013/0168803 A1* | 7/2013 | Haddad | H01L 21/6835 257/507 |
| 2014/0141253 A1 | 5/2014 | Fujii et al. | |
| 2014/0349095 A1* | 11/2014 | Beckmann | C04B 41/009 428/215 |
| 2016/0056554 A1 | 2/2016 | Costello | |

OTHER PUBLICATIONS

ISR/WO, dated Jan. 18, 2018, RAY0349PCT, PCT Application No. PCT/US2017/056875, 15 pages.
Joshi et al., Cleave Engineered Layer Transfer using Porous Silicon, ECS Transactions, 2008, 16 (8) 263-270.
OA dated Aug. 26, 19 in RAY0349GC, Application No. GC 2017-34126, 4 pages.
Taiwanese Office Action Application No. 106135743; dated Mar. 24, 2021; pp. 8.

* cited by examiner

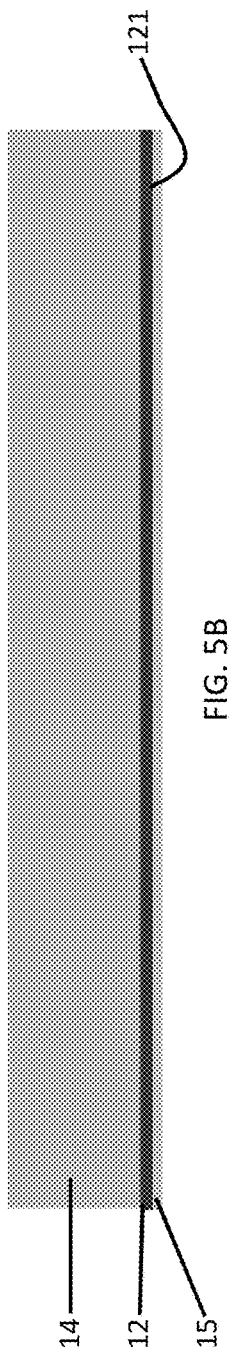
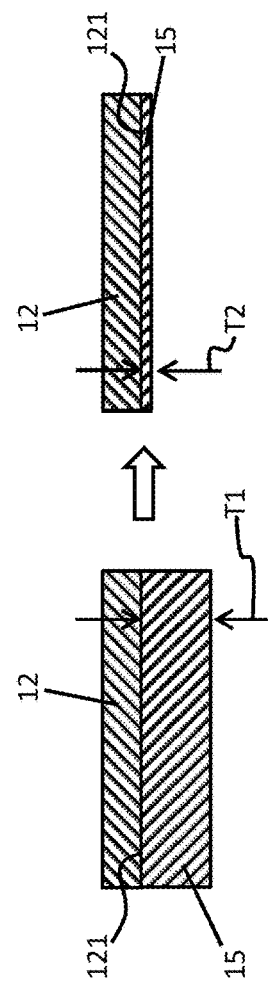
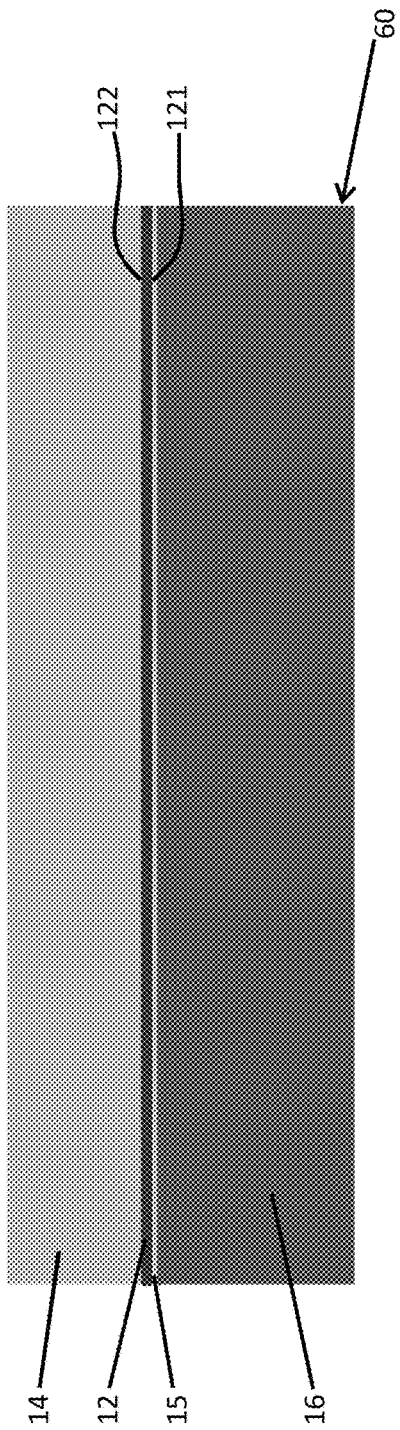

US 11,177,155 B2

DIRECT BOND METHOD PROVIDING THERMAL EXPANSION MATCHED DEVICES

DOMESTIC PRIORITY

This application is a divisional of U.S. application Ser. No. 15/331,149 titled "DIRECT BOND METHOD PROVIDING THERMAL EXPANSION MATCHED DEVICES", which was filed Oct. 21, 2016. The entire contents of U.S. application Ser. No. 15/331,149 are incorporated by reference herein.

BACKGROUND

The present disclosure relates to a direct bond method and to a direct bond method that provides for thermal expansion matched devices for true heterogeneous three-dimensional integration.

Many currently used infrared sensor chip assemblies include silicon readout integrated circuits (ROIC) that are hybridized to mercury cadmium tellurium (HgCdTe) detector arrays using indium (In) bumps. Problems with such assemblies exist, however, in that these indium bumps tend to fail as a result of their inability to survive the large number of thermal cycles required for the assembly processes due to the coefficient of thermal expansion (CTE) mismatch between silicon (Si) and the HgCdTe.

While previous attempts to address these problems have been attempted, none are completely useful or satisfactory. For example, for indium bump (IB) focal plane arrays (FPAs), the approach has been to attempt to CTE match the ROIC to a detector by adhesively bonding titanium (Ti) and silicon (Si) shims to the back of a sensor chip assembly (SCA) after dicing and hybridization. While this approach can be effective, it is an expensive die-level process and is performed manually by skilled labor.

As another example, for heterogeneous three-dimensional (3D) integration, approaches include epitaxial growth of III-V semiconductor materials, such as gallium nitride (GaN), on a silicon (Si) substrate using buffer layers to provide the lattice match, or ultrasonically bonding a bonded completed III-V die to a silicon (Si) circuit. In both of these cases, III-V layers can tend to cause degraded performance due to stress associated with CTE mismatches between the III-V devices and silicon (Si) substrates.

SUMMARY

According to one embodiment, a method of transferring an integrated circuit (IC) onto an alternative substrate is provided at a wafer level to enable coefficient of thermal expansion (CTE) matching for a circuit layer to a different material. The method is executable relative to a wafer with a circuit layer, a first major surface, a second major surface opposite the first major surface, and a substrate affixed to the first major surface. The method includes temporarily bonding a handle to the second major surface, removing a majority of the substrate to expose the first major surface and bonding a second substrate to the first major surface with deposited bonding material.

According to another embodiment, a method of transferring an integrated circuit (IC) onto an alternative substrate at a wafer level is provided to enable coefficient of thermal expansion (CTE) matching. The method is executable relative to a complementary-metal-oxide-semiconductor (CMOS) wafer with a circuit layer, a first major surface, a second major surface opposite the first major surface, and a substrate affixed to the first major surface. The method includes temporarily bonding a handle to the second major surface, removing a substantial portion of the substrate to expose the first major surface through a thin layer of substrate remainder and bonding a Sapphire substrate to the first major surface and the thin layer of substrate remainder with a deposited and polished bonding oxide.

According to another embodiment, a wafer level integrated circuit (IC) transfer enabling structure is provided. The structure includes a circuit layer having a first major surface and a second major surface opposite the first major surface, a substrate remainder, which is substantially thinner than the circuit layer, affixed to the first major surface, a handle temporarily bonded to the second major surface, and a Sapphire substrate bonded to the first major surface and the substrate remainder with a deposited and polished bonding oxide.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIG. 5A is a side view of bonding material applied to the substrate-lacking wafer of FIG. 4A;

FIG. 5B is a schematic illustration of the deposition and then polishing of the bonding material of FIG. 5A in accordance with embodiments;

FIG. 6 is a side view of a new substrate bonded to the formerly sub strate-lacking wafer by the bonding material of FIGS. 5A and 5B;

DETAILED DESCRIPTION

As will be discussed below, a coefficient of thermal expansion (CTE) matched readout integrated circuit (ROIC) is produced at a wafer level before hybridization to thereby increase yield and decrease costs. The method of production can also be used to produce oxide bonded three-dimensional (3D) ICs using mixed semiconductor materials as in true heterogeneous devices.

Figure 1:
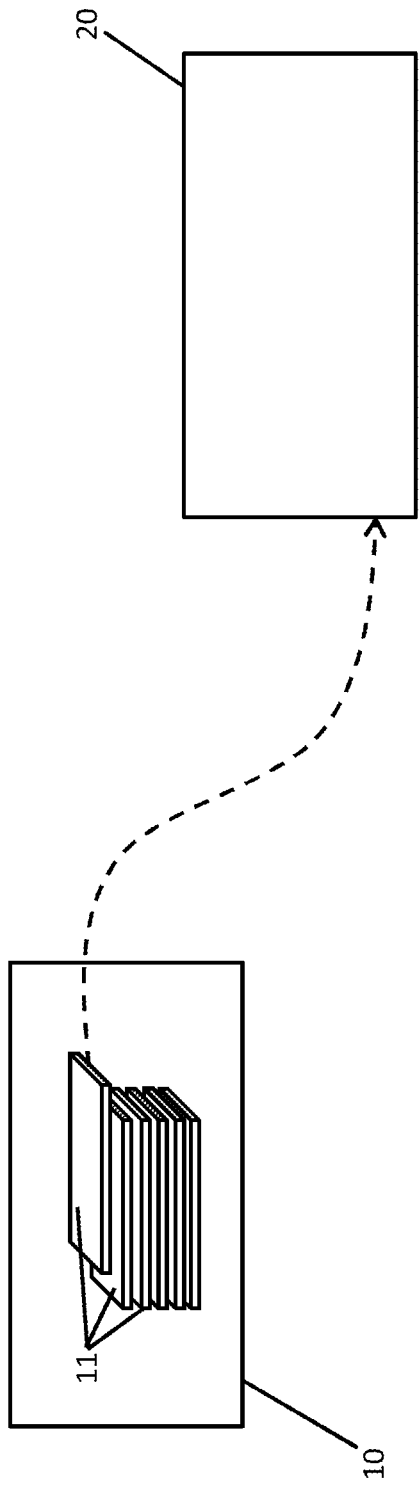
FIG. 1 is a schematic illustration of a wafer manufacturing foundry and a processing plant in accordance with embodiments.

With reference to FIG. 1, a wafer manufacturing foundry 10 is provided remotely from a processing plant 20. The wafer manufacturing foundry 10 is configured and equipped to manufacture standard complementary-metal-oxide-semiconductor (CMOS) wafers 11, for example, which can be shipped to the processing plant 20 for further processing as will be described below. While the wafer manufacturing foundry 10 is illustrated and described herein as being remote and separate from the processing plant 20, it is to be understood that this is not necessary and that the two features can be provided in a single element. Even then, however, the manufacturing processes used to produce the CMOS wafers 11 are separate and distinct from the further processing that is described below.

With reference to FIGS. 2-7, a method of transferring an integrated circuit (IC) onto an alternative substrate at a wafer level to enable CTE matching is provided. While it is understood that the method is executable in the processing plant 20 relative to various types of wafers including, for example, the CMOS wafers 11 produced in the wafer manufacturing foundry 10 (each shown in FIG. 1), the following description will relate only to the cases where the method is executed in the processing plant 20 relative to the CMOS wafers 11 produced in the wafer manufacturing foundry 10. This is done for clarity and brevity and should not be considered as limiting the following description or claims in any way.

Figure 2:
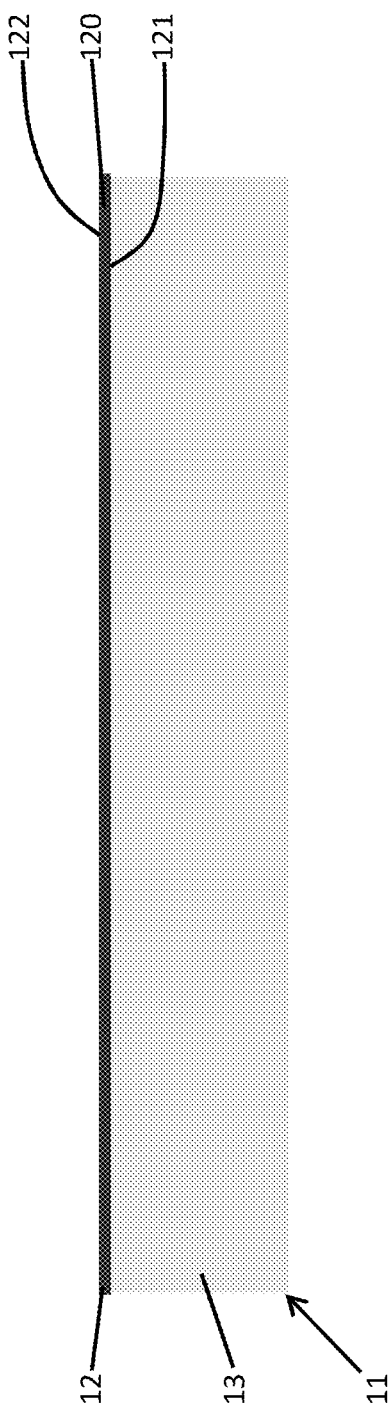
FIG. 2 is a side view of a wafer produced in the foundry of FIG. 1 in accordance with embodiments.

As shown in FIG. 2, each one of the CMOS wafers 11 includes a circuit layer 12 and a substrate 13. The circuit layer 12 is substantially planarized and may include various circuit elements, traces and CMOS devices. The circuit layer 12 may be approximately 10 μm thick and has a body 120, a first major surface 121 on a first side of the body 120 and a second major surface 122 on a second side of the body 120 opposite the first side of the body 120. The substrate 13 is affixed or bonded to the first major surface 121.

Figure 3:
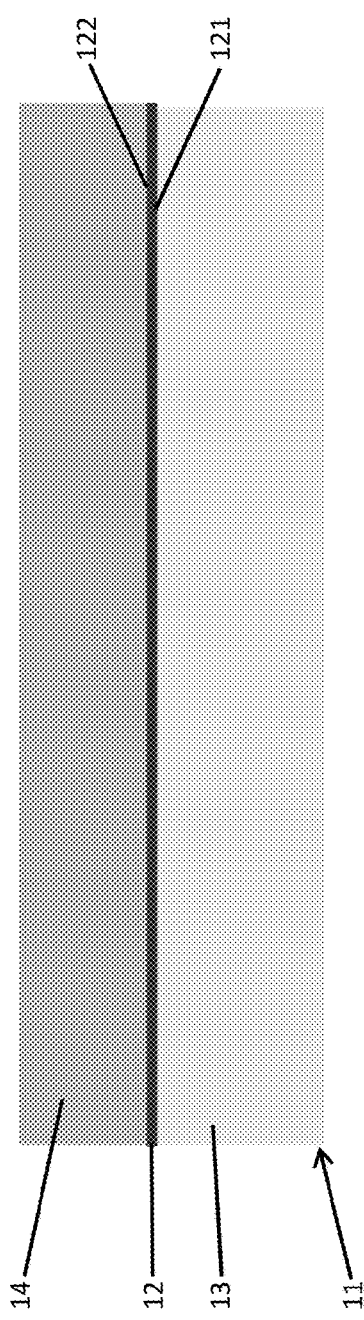
FIG. 3 is a side view of a handle that is temporarily bonded to the wafer of FIG. 2.

As shown in FIG. 3, a wafer-level handle (or simply handle) 14 is temporarily bonded to the second major surface 122 of the circuit layer 12. The handle 14 may be formed of any suitable, somewhat rigid material including, but not limited to, metallic materials, ceramic materials and organic or inorganic dielectric, semiconductor or conductive materials. The handle 14 can be flat and have a uniform thickness and may be, but is not required to be, planarized. In any case, the handle 14 should generally conform to the topography of the second major surface 122. The temporary bond between the handle 14 and the second major surface 122 may be provided by way of adhesive bonding using a thermoplastic adhesive.

Figure 4A:
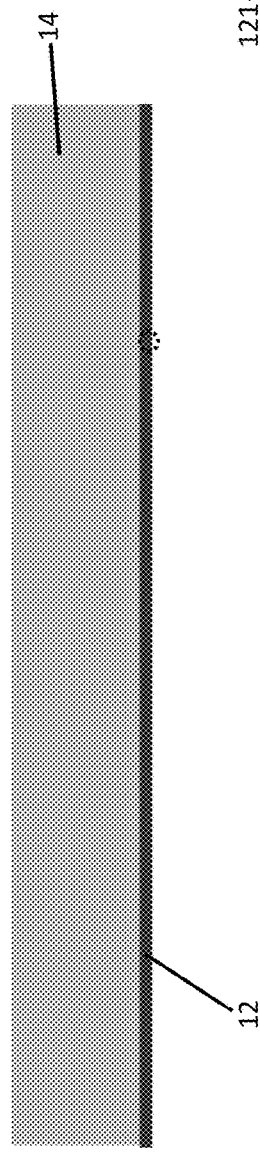
FIG. 4A is a side view of the handle and the wafer of FIG. 3 following removal of substrate material from the wafer.
Figure 4B:
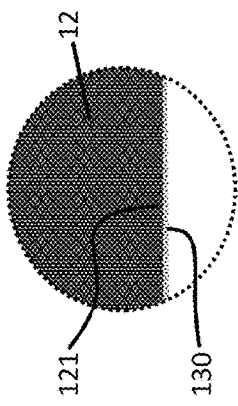
FIG. 4B is an enlarged side view of the encircled portion of the circuit layer following the removal of the substantial portion of the substrate material in accordance with embodiments.

As shown in FIG. 4A, all or a substantial portion (e.g., ~90% or a majority) of the substrate 13 is removed. The removal of the substantial portion of the substrate 13 can be accomplished or conducted by way of etching, grinding and polishing or, more particularly, by way of a grinding of the bulk of the material of the substrate 13 stopping at a depth of approximately 10× the grit size from the desired final thickness and then polishing the last bits of the material of the substrate 13 away from the circuit layer 12. In any case, the removal of the substantial portion of the substrate 13 serves to completely expose the first major surface 121 or, as shown in FIG. 4B, to nearly completely expose the first major surface 121 through a thin layer of substrate remainder 130. In accordance with embodiments, the thin layer of the substrate remainder 130 (if it exists) is substantially thinner than the circuit layer 12 even where the circuit layer 12 is approximately ~10 μm thick. As an example, for a modern complementary-metal-oxide-semiconductor (CMOS) process, the wafer would be thinned so that the thickness of the substrate remainder would be 10 μm or less.

Although FIGS. 4A and 4B illustrate that the substrate 13 can be completely removed or that a substantial portion of the substrate 13 can be removed with only a thin layer of substrate remainder 130 remaining, the following description will relate to the former case for purposes of clarity and brevity.

As shown in FIG. 5A, an adhesive 15 is applied to the first major surface 121 of the circuit layer 12 that is now exposed as a result of the removal of the substrate 13. In accordance with embodiments and, as shown in FIG. 5B, the adhesive 15 may include bonding oxide that is deposited (e.g., by physical vapor deposition or PVD) onto the first major surface 121 up to a first thickness T1 and then polished (e.g., by chemical mechanical polishing or CMP) down to a second thickness T2. The first thickness T1 may be approximately 2-15 nm and the second thickness T2 may be approximately 0.3-0.5 nm.

As shown in FIG. 6, a wafer-level second substrate (or simply new or second substrate) 16 is bonded to the first major surface 121 of the circuit layer 12 (and any thin layer of substrate remainder 130 that remains on the first major surface 121) using low-temperature oxide bonding (i.e., with the deposited and polished bonding oxide or adhesive 15). The second substrate 16 may be approximately 725 μm thick and may be provided as or with a plasma activated oxide surface. The second substrate 16 material can be an aluminum oxide, Sapphire or ceramic. In the particular and exemplary case of the second substrate 16 being formed of Sapphire and/or other similar materials, the second substrate 16 effectively functions as a thermal matching substrate.

As used herein, a thermal matching substrate may be any substrate that, when bonded to the circuit layer 12, alters the rate of thermal expansion of the circuit layer 12 in a desirable manner. In other words, the thermal matching substrate may include any material suitable for bonding to the circuit layer 12 and having a CTE that is different than the CTE of the circuit layer 12. In certain embodiments, the thermal matching substrate can be a substrate that forms a composite-semiconductor structure having a desired rate of thermal expansion. This desired rate of thermal expansion may be substantially equal to the rate of thermal expansion of a substrate to which the circuit layer 12 is to be hybridized.

The second substrate 16, acting as a thermal matching substrate, may have a CTE that is greater than the CTE of the circuit layer 12. As a result, when the second substrate 16 is bonded to the circuit layer 12 (and a balancing substrate that may also be present), the second substrate 16 causes the circuit layer 12 to expand and contract at a greater rate in response to temperature changes. Alternatively, the second substrate 16 may have a CTE that is smaller than the CTE of the circuit layer 12. As a result, when the second substrate 16 is bonded to the circuit layer 12 (and the balancing substrate that may also be present), the second substrate 16 causes the circuit layer 12 to expand and contract at a slower rate in response to temperature changes. Here, the balancing substrate (not shown) may be any substrate that, when bonded to the second substrate 16, reduces or eliminates warping of the resulting composite-semiconductor structure of the second substrate 16 and the circuit layer 12 without substantially impacting the effective CTE of the composite-semiconductor structure.

In any case, FIG. 6 illustrates a wafer level integrated circuit (IC) transfer enabling structure 60. The structure 60 includes the circuit layer 12 having the first major surface 121 and the second major surface 122 opposite the first major surface 121, a potentially very thin or non-existing substrate remainder 130 (not shown in FIG. 6) that is substantially thinner than the circuit layer 12 affixed to the first major surface 121, the handle 14 being temporarily bonded to the second major surface 122 and a second (e.g., Sapphire) substrate 16. The second substrate 16 is bonded to the first major surface 121 (and any thin layer of substrate remainder 130) with the adhesive 15.

Figure 7:
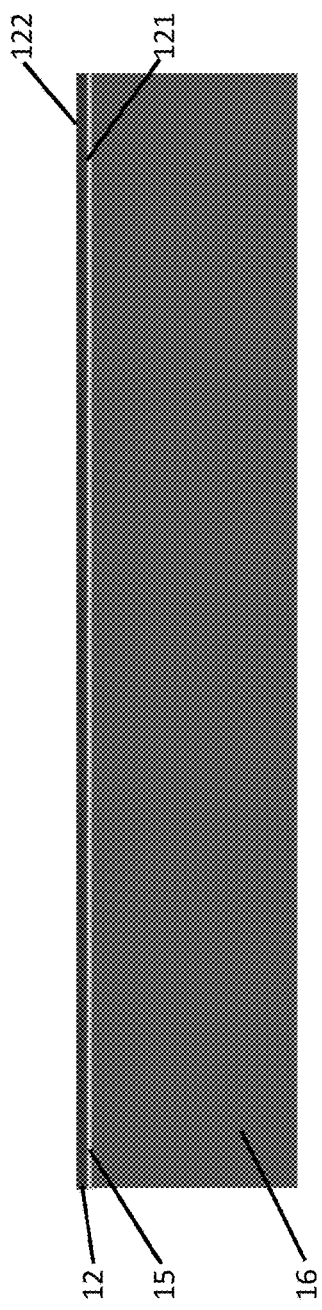
FIG. 7 is a side view of a wafer bonded to the new substrate of FIG. 6 with the temporary handle of FIG. 3 having been removed.

With reference to FIG. 7, once the second substrate 16 is bonded to the first major surface 121 of the circuit layer 12, the handle 14 is removed leaving the second major surface 122 exposed and the circuit layer 12 permanently bonded to the second substrate 16.

Figure 8:
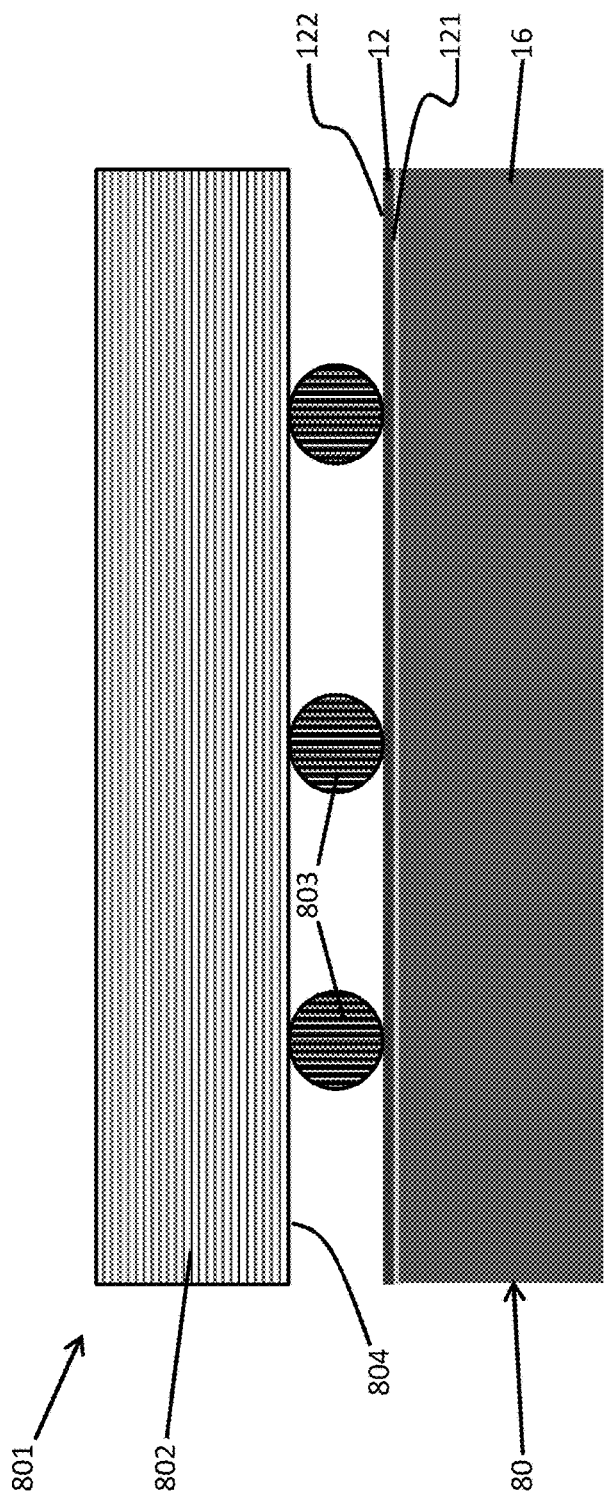
FIG. 8 is a side view of an oxide bonded, three-dimensional (3D) integrated circuit (IC) using mixed semiconductor materials in accordance with embodiments.

In accordance with further embodiments and, with reference to FIG. 8, the circuit layer 12 to which the second substrate 16 is permanently bonded may form a hybridization ready structure 80 that is ready to be hybridized to a detector array. As such, as shown in FIG. 8, a device 801 is formed by hybridizing the circuit layer 12 (with the second substrate 16) to a thermally matched second substrate 802 using interconnects 803 that are deposited on the second major surface 122 of the circuit layer 12 and on complementary surface 804 of the second substrate 802. The second substrate 802 may be provided, for example, as a detector array and as such includes an array of photo-electric elements therein. At least one or more of the interconnects 803 may be formed of indium (as in the case of indium bumps) and/or other similar materials (e.g., tin, lead, bismuth alloy or any other suitable conductive material).

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

For comparison, U.S. Pat. No. 8,154,099 describes a CTE matching method where the CTE matching material is atomically bonded between two layers of semiconductor in order to adjust a composite material CTE to match another layer. In this case, the semiconductor layers are relatively thin and the CTE matching material is insufficiently stiff whereby a three layer structure is used to prevent the resulting structure from warping during temperature excursions. The description provided above, however, relates to cases in which the semiconductor layer (i.e., the circuit layer 12) is relatively thin (e.g., approximately 10 μm) and the CTE matching substrate (i.e., the second substrate 16) is relatively thick (e.g., approximately 1500 μm). This significant thickness difference allows the CTE matching substrate to be highly resistant to warping so that warping effects in the resulting composite structure are effectively insignificant.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A wafer level integrated circuit (IC) transfer enabling structure, comprising:
    a circuit layer having a first major surface and a second major surface opposite the first major surface;
    a substrate remainder, which is substantially thinner than the circuit layer, affixed to the first major surface;
    a handle temporarily bonded to the second major surface;
    a sapphire substrate comprising a plasma activated oxide surface; and
    bonding oxide to bond the substrate remainder with the plasma activated oxide surface of the sapphire substrate,
    wherein the bonding oxide is deposited onto the substrate remainder to have a first thickness of approximately 2-15 nm and is polished, prior to the bonding oxide bonding the substrate remainder with the plasma activated oxide surface of the sapphire substrate, to have a second thickness of approximately 0.3-0.5 nm.

2. The structure according to claim 1, wherein a thermoplastic adhesive temporarily bonds the handle to the second major surface.

3. The structure according to claim 1, wherein the circuit layer is approximately 10 μm thick.

4. The structure according to claim 1, wherein the circuit layer is approximately 10 μm thick and the sapphire substrate is approximately 1500 μm thick.

5. A wafer level integrated circuit (IC) transfer enabling structure, comprising:
    a circuit layer having a first major surface and a second major surface opposite the first major surface;
    a substrate remainder, which is substantially thinner than the circuit layer, affixed to the first major surface;
    a handle temporarily bonded to the second major surface;
    a sapphire substrate comprising a plasma activated oxide surface; and
    bonding oxide to bond the substrate remainder with the plasma activated oxide surface of the sapphire substrate,
    wherein the bonding oxide is deposited onto the substrate remainder to have a first thickness and is polished, prior to the bonding oxide bonding the substrate remainder with the plasma activated oxide surface of the sapphire substrate, to have a second thickness which is thinner than the first thickness.

* * * * *